United States Patent
Desplats et al.

(10) Patent No.: US 7,560,940 B2
(45) Date of Patent: Jul. 14, 2009

(54) METHOD AND INSTALLATION FOR ANALYZING AN INTEGRATED CIRCUIT

(75) Inventors: Romain Desplats, Castanet Tolosan (FR); Kevin Sanchez, Toulouse (FR); Félix Beaudoin, Santa Clara, CA (US)

(73) Assignee: Centre National d'Etudes Spatiales, Paris (FR)

( * ) Notice: Subject to any disclaimer, the term of this patent is extended or adjusted under 35 U.S.C. 154(b) by 0 days.

(21) Appl. No.: 11/664,120

(22) PCT Filed: Sep. 30, 2005

(86) PCT No.: PCT/FR2005/002422

§ 371 (c)(1),
(2), (4) Date: Mar. 30, 2007

(87) PCT Pub. No.: WO2006/037881

PCT Pub. Date: Apr. 13, 2006

(65) Prior Publication Data

US 2008/0088324 A1    Apr. 17, 2008

(30) Foreign Application Priority Data

Oct. 1, 2004    (FR)    ................................. 04 10424

(51) Int. Cl.
*G01R 31/302*    (2006.01)
*G01R 31/308*    (2006.01)
*G01N 23/00*    (2006.01)
*G06K 9/00*    (2006.01)

(52) U.S. Cl. ................. 324/752; 324/753; 250/307; 250/309; 250/310; 250/311; 382/145; 382/147; 382/149

(58) Field of Classification Search ................. 324/753, 324/752; 250/306–311; 382/145–151
See application file for complete search history.

(56) References Cited

U.S. PATENT DOCUMENTS

| | | | |
|---|---|---|---|
| 4,698,587 A * | 10/1987 | Burns et al. ................. 324/765 |
| 5,270,643 A * | 12/1993 | Richardson et al. ......... 324/751 |
| 6,483,322 B2 * | 11/2002 | Aoyama et al. ............. 324/661 |
| 6,501,288 B1 | 12/2002 | Wilsher |
| 2004/0201375 A1 * | 10/2004 | Niv et al. ................. 324/158.1 |
| 2005/0006602 A1 * | 1/2005 | Perdu et al. ............ 250/492.22 |
| 2006/0220664 A1 * | 10/2006 | Stellari et al. ............... 324/752 |

FOREIGN PATENT DOCUMENTS

WO    2004092754    10/2004
WO    2005008850    1/2005

* cited by examiner

*Primary Examiner*—Ha Tran T Nguyen
*Assistant Examiner*—Karen M Kusumakar
(74) *Attorney, Agent, or Firm*—Young & Thompson

(57) ABSTRACT

A method and installation for analyzing an integrated circuit. The method includes, for a plurality of surface points of the integrated circuit, the following steps: applying a laser radiation, in one point of the surface of the integrated circuit; exciting the circuit; collecting the response of the circuit to the excitation; calculating the propagation time intervening between the excitation time and the response-collecting time; and creating an image of the integrated circuit showing a value representing the propagation time at each point of laser radiation application.

10 Claims, 3 Drawing Sheets

METHOD AND INSTALLATION FOR ANALYZING AN INTEGRATED CIRCUIT

FIELD OF THE INVENTION

The present invention relates to a method for analyzing an integrated circuit.

BACKGROUND OF THE INVENTION

Integrated circuits operate at high speed and the slightest internal weakness could result in failure of their overall operation. For circuits used in particularly stressed environments, such as those encountered in space missions, the radiative environment or the temperature constraints for example increase the sensitivity to weaknesses or to small internal faults.

To determine the weaknesses of integrated circuits, a known technique is to subject integrated circuits to local laser radiation and to assess the operation of the circuit under such a stress.

Specifically, a known technique is to excite the circuit with an input signal while the latter is subjected to laser radiation and to check that the result obtained at the output of the circuit is correct. The laser is applied to a reduced area of the integrated circuit and the test is repeated for several positions of the laser on the surface of the circuit, so as to sweep the entire circuit and thus create a map of the circuit for identifying the areas which, when they are subjected to laser radiation, lead to the circuit outputting a non-compliant result.

Such a method is disclosed, for example, in document U.S. Pat. No. 6,483,322 and document U.S. Pat. No. 4,698,587.

These analysis methods are relatively effective but provide for only detecting major faults in the circuit which, when they are subjected to laser radiation, lead to a visible malfunctioning of the circuit, in the sense that it does not provide the expected result.

However, such a method is not capable of locating minor faults which nevertheless can prove detrimental during repeated use of the circuit in a particularly stressed environment.

SUMMARY OF THE INVENTION

An object of the invention is to propose a circuit analysis method and a circuit analysis installation for determining such minor faults or sensitive areas.

To this end, an aspect of the invention is a method for analyzing an integrated circuit, characterized in that it comprises, for a plurality of points on the surface of the integrated circuit:
- a step for applying laser radiation at a point of the surface of the integrated circuit;
- a step for exciting the circuit;
- a step for collecting the response of the circuit to the excitation;
- a step for calculating the propagation time separating the instant of excitation of the circuit from the instant of collection of the response; and
- a step for creating an image of the integrated circuit illustrating a value representing the propagation time for each point of application of the laser radiation.

According to particular implementations, the analysis method comprises one or more of the following features:
- a step for exciting the circuit in the absence of laser radiation;
- a step for collecting the response of the circuit to the excitation;
- a step for calculating the propagation time in the absence of laser radiation separating the instant of excitation of the circuit from the instant of collection of the response;
- the value representing the propagation time is equal to the variation in propagation time, this variation being defined by the difference between the propagation time in the presence of laser radiation at a determined point and the propagation time in the absence of laser radiation.
- the laser radiation has a wavelength of between 800 nm and 1400 nm;
- the laser radiation wavelength is chosen to be in the group including 1064 nm and 1340 nm;
- the laser radiation is applied at each point in a manner that is synchronous with the step for exciting the circuit;
- the laser radiation is applied at each point in a manner that is asynchronous with the step for exciting the circuit;
- the laser radiation is pulsed with at least one pulse at each point of the circuit;
- the laser radiation is modulated with at least one pulse at each point of the circuit; and
- the laser radiation is continuous.

Another aspect of the invention is an installation for analyzing an integrated circuit, characterized in that it comprises:
- means for applying laser radiation successively at a plurality of points on the surface of the integrated circuit;
- means for exciting the circuit for each application of the laser radiation at a point;
- means for collecting the response of the circuit to the excitation;
- means for calculating, for each point, the propagation time separating the instant of excitation of the circuit from the instant of collection of the response; and
- means for creating an image of the integrated circuit illustrating a value representing the propagation time for each point of application of the laser radiation.

BRIEF DESCRIPTION OF THE DRAWINGS

The invention will be more clearly understood on reading the following description given purely by way of example and with reference to the drawings in which.

DETAILED DESCRIPTION OF THE EMBODIMENTS

Figure 1:
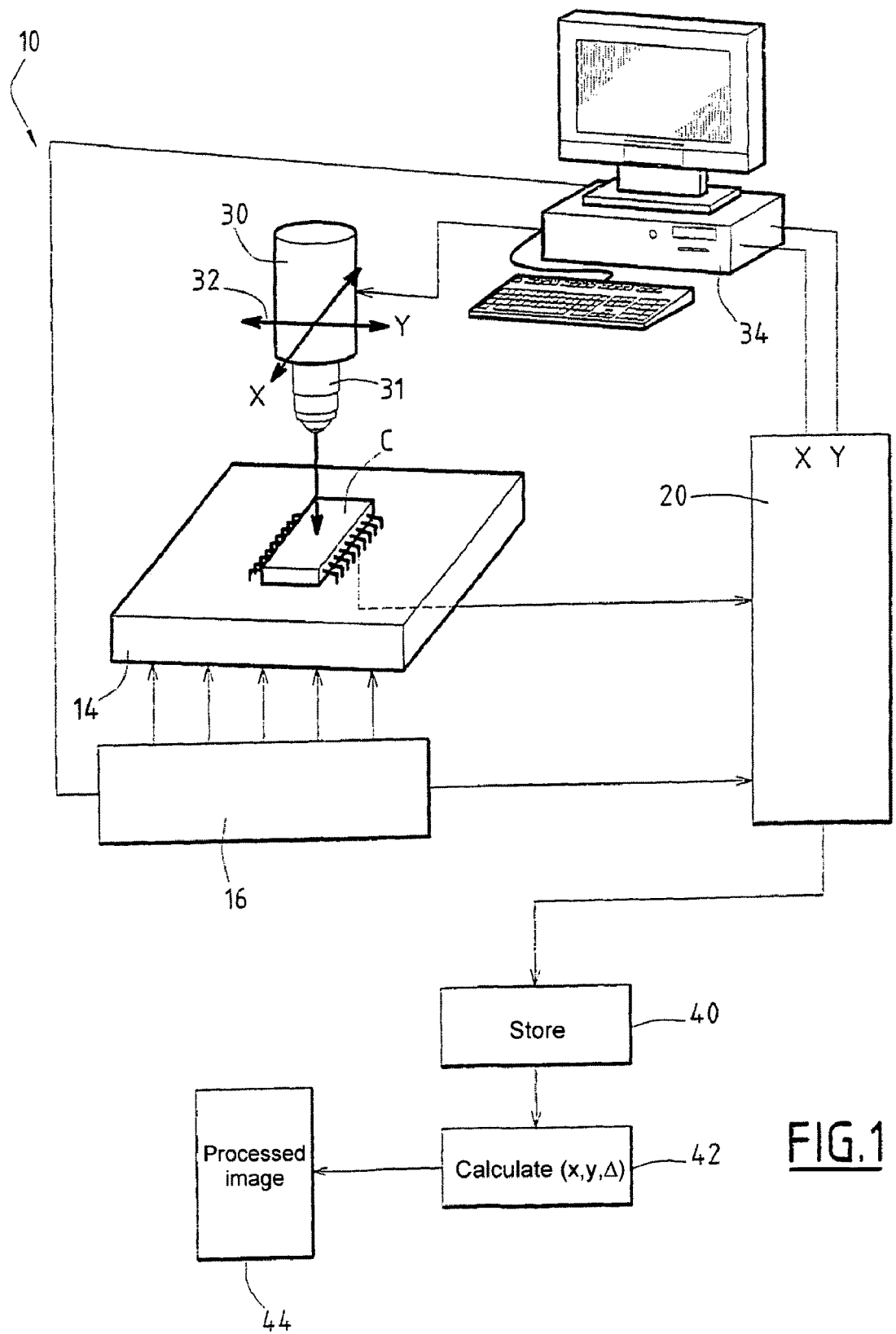
FIG. 1 is a schematic view of an installation for analyzing a circuit implementing a method according to the invention.

The installation illustrated in FIG. 1 comprises an installation 10 for analyzing an integrated circuit C comprising a plate 14 for receiving and connecting the integrated circuit and a generator 16 of a test sequence, the outputs of which are connected to the inputs of the integrated circuit via the plate 14. At least one output of the integrated circuit is connected to a time measurement unit 20.

The test sequence generator 16 is connected to an input of the time measurement unit 20 in order to receive a pulse at the instant of excitation of the circuit by sending to the latter a predetermined test sequence. The time measurement unit 20 receives the response of the circuit at the instant when the response emerges from the circuit after the information has propagated inside the circuit.

Furthermore, the installation 10 comprises a laser source 30 arranged at right angles to the circuit to be tested and on which a lens 31 is fitted. The laser source 30 is carried by means 32 for moving the laser beam in the plane of the circuit in two directions perpendicular to each other.

The movement means 32 are connected to a driving unit 34 intended to control the position of the laser and to control its activation.

The driving unit 34 is formed for example of a computer associated with control means.

Furthermore, the driving unit 34 is connected to the test sequence generation unit 16 in order to activate the excitation of the circuit in a manner synchronized with the local illumination of the circuit by the laser 30.

According to one embodiment, the laser beam has a wavelength that is greater than 1100 nm and preferably equal to 1340 nm, and is intended to induce a thermal effect in the semiconductor material intended to modify its local resistivity.

According to another embodiment, the laser beam has a wavelength that is less than 1100 nm, preferably between 800 nm and 1100 nm, and is intended to induce photoelectric phenomena in the material of the circuit.

Furthermore, the laser has a wavelength of between 1000 nm and 1400 nm when it passes through a layer of silicon. By virtue of the transparency of silicon at these wavelengths, analyses can be performed through the substrate, without being screened by the metal layers distributed on the surface of the circuit.

Specifically, when photoelectric phenomena are revealed and when the laser passes through a layer of silicon, the laser preferably has a wavelength of 1064 nm, so as to allow the laser radiation to induce the creation of electron-hole pairs in the semiconductor forming the circuit, these electron-hole pairs giving rise to the flow of a current.

The laser beam has a Gaussian distribution when it has reached its resolution limit.

The driving unit 34 is connected to the time measurement unit 20 in order to supply the X and Y coordinates of the laser beam in the plane of the circuit, these coordinates representing the position of the point of impact of the laser beam on the circuit.

Furthermore, the installation comprises a real time storage unit 40 intended to store, during each test performed on the circuit, the X, Y positions of the laser beam impact point and the instant t1 of excitation of the circuit and the instant t2 of collection of a response at the output of the circuit. These storage means are intended to receive this information at a very high rate when the information is determined by the unit 20.

The storage means 40 are connected to computation means 42 intended to determine, for each laser beam impact point defined by coordinates X, Y, a value representing the propagation time t of the signal in the circuit. This value is for example the variation Δ between the propagation time t in the presence of laser radiation and the propagation time $t_R$ in the absence of laser radiation, hereafter referred to as the reference propagation time. This variation is defined by $\Delta = t - t_R = t2 - t1 - (t02 - t01)$, where t1 and t2 are the instants of excitation and of collection in the presence of a laser beam, and t01 and t02 are the instants of excitation and of collection in the absence of a laser beam for the same test sequence.

The computation means 42 are intended to determine the triplets (X, Y, Δ) for all the points of the circuit. They are connected at their output to means 44 for creating an image of the circuit, this image representing the values of the variation Δ of the propagation time resulting from the presence of a laser beam tracking the entire surface of the circuit.

Figure 2:
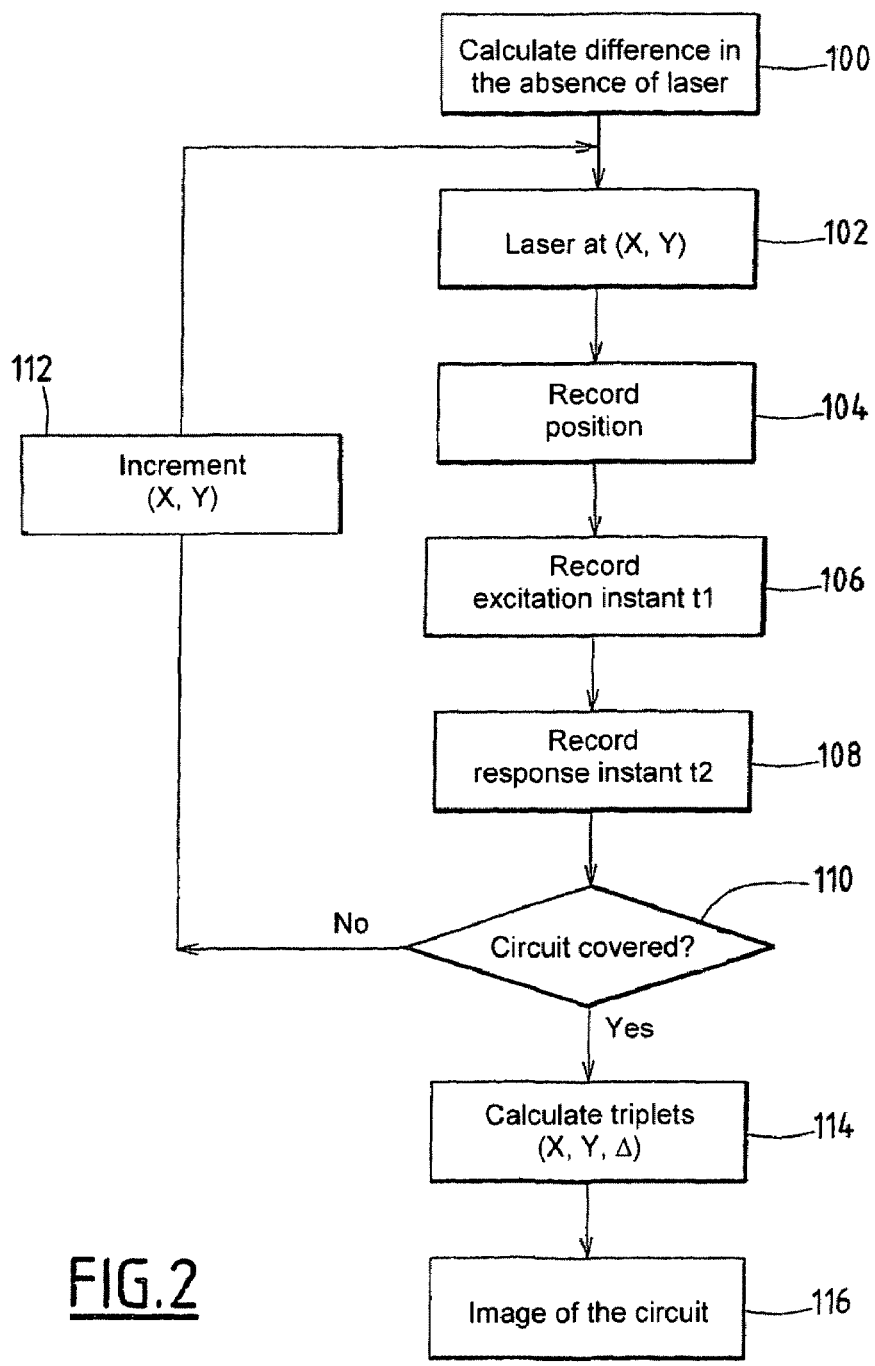
FIG. 2 is a flow chart of the algorithm implemented by the installation of FIG. 1.

The installation of FIG. 1 is intended to implement the algorithm illustrated in FIG. 2.

Initially, at step 100, no laser radiation is applied to the circuit. The reference propagation time $t_R$ in the absence of laser radiation is measured at a single point of the circuit. To this end, the circuit is excited by a test sequence. The instant t01 of excitation of the circuit and the instant t02 of collection of the response are determined by the time measurement unit. These values are stored in the storage means 40.

At step 102, the laser is controlled to illuminate a reduced region of the circuit of coordinates X, Y. At step 104, these coordinates are recorded in the storage means 40. The circuit thus illuminated or illuminated beforehand by the laser beam is excited at step 106 by sending a test sequence, and the excitation instant t1 is recorded. The instant t2 at which the response is obtained by the unit 20 is recorded at step 108 in the storage means 40.

According to a first embodiment of the invention, the laser beam is continuous.

For steps 102 to 108, according to this first embodiment, the laser radiation is applied to a reduced region of the circuit simultaneously with the application of the test sequence, such that the circuit is illuminated during the test sequence.

According to a second embodiment of the invention, the laser beam is, instead, pulsed with pulse durations preferably less than a nanosecond or the laser beam is modulated with pulse durations preferably less than or equal to the duration of the test sequence applied to the circuit. The circuit is then illuminated for predetermined durations of the test sequence.

According to the second embodiment, the test sequence is preferably repeated several times in order to measure the variation in propagation time for several different moments in the test sequence.

According to the second embodiment, the laser beam is applied for a predetermined total duration and tracking a reduced area of the circuit, either synchronously or asynchronously with the application of the test sequence.

When the applications are referred to as synchronous, the application of the laser starts and stops at moments that are fixed and predetermined with respect to the start and end of the test sequence.

When the applications are referred to as asynchronous, the application of the laser beam starts and stops at moments that are variable and random with respect to the start and end of the test sequences.

In the first and second embodiments, steps 102 to 108 are repeated successively for different positions of the point of impact of the laser beam tracking the circuit, such that the laser sweeps the entire circuit. To this end, at step 110, a check is performed to determine whether the entire circuit has been covered. If that is not the case, the laser is moved at step 112 by the means 32, such that the impact point is moved slightly, then steps 102 to 108 are repeated. Step 112 is conducted such that, by implementing the loop, the entire surface of the circuit is gradually covered.

At the end of the full sweep of the circuit, the excitation instant t1 and response instant t2, for each X, Y-coordinate position are stored in the storage means 40.

At step 114, the data thus stored is processed. Specifically, a reference propagation time $t_R$ is calculated from the excitation instant t01 and response instant t02 which are obtained when the circuit is operating in the absence of stress by a laser beam. The propagation time t is calculated from the excitation instant t1 and response collection instant t2 which are obtained in the presence of the laser beam for each position of application of the laser beam of coordinates X, Y.

Then, at step 114, all the triplets (X, Y, Δ) are calculated for each of the laser beam impact points X, Y, where Δ is the temporal variation of propagation between the reference propagation time $t_R$ and the propagation time t calculated for each position of the laser beam of coordinates X, Y.

Figure 3:
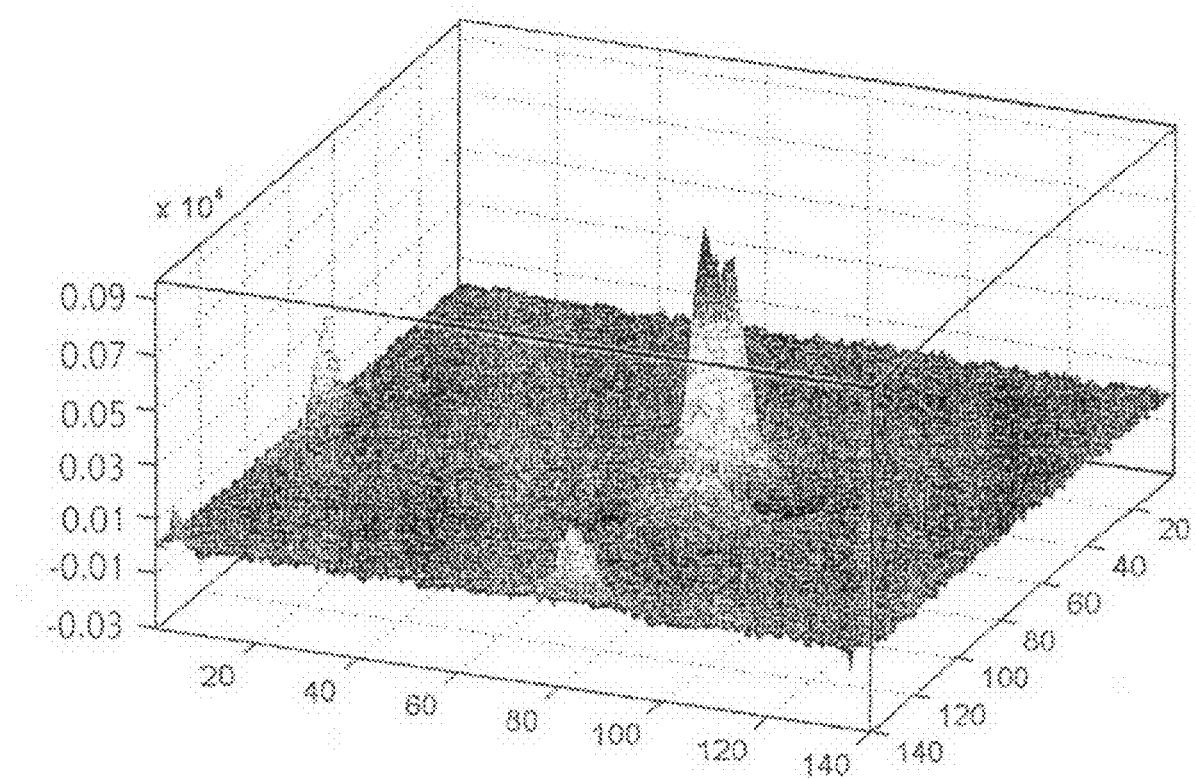
FIG. 3 is an example image of a circuit, the image being obtained by implementing the method according to the invention.

At step 116, an image of the circuit is produced by the image creation device 44. Such an image is illustrated in FIG. 3. This image illustrates the temporal variation in the propagation delay, this variation being calculated at step 114 for each of the X, Y-coordinate positions of stress applied by the laser beam.

To facilitate the visualization of areas of failure or weakness of the circuit, an image in two dimensions according to the X and Y axes is extracted from the image illustrated in FIG. 3. On this two-dimensional image, the variations in propagation time Δ are coloured using various colours.

This two-dimensional image is superimposed on the optical image of the circuit referenced by the coordinates X, Y. This optical image is obtained using the laser 30 or a CCD optical camera.

The presence of the laser beam at a point produces a variation in the propagation time. This variation is particularly significant for some areas of the circuit. This variation can be positive or negative depending on the effect of the laser beam, such that, for some areas, the response is obtained more rapidly in the presence of the laser beam while, for others, the response is delayed. In some cases, the variation will lead to erroneous information being propagated in the circuit. The erroneous response of the circuit will itself also be more or less delayed or advanced. Advantageously the temporal variation of an erroneous response may be observed on another output of the circuit.

The areas where the temporal variation is significant appear clearly in the image of FIG. 3 and correspond a priori to regions of the circuit having faults that are indeed minor since they are not of the type to cause the circuit to produce an erroneous result but of the type that may be detrimental for the circuit when operating in a very stressed environment.

According to one embodiment of the invention, the value representing the propagation time t is equal to the variation in time between the excitation instant t1 and the collection instant t2, (t=t2−t1), when the laser beam is or has been applied to the circuit C. In that case, the reference propagation time $t_R$, representing an average value not representative of faults or sensitive areas of the circuit, is not considered.

The invention claimed is:

1. A method for analyzing an integrated circuit, wherein it comprises, for a plurality of points on the surface of the integrated circuit:
   a step for applying laser radiation at a point of the surface of the integrated circuit;
   a step for exciting the circuit by a test sequence;
   a step for collecting the response of the circuit to the excitation;
   a step for calculating the propagation time separating the instant of excitation of the circuit from the instant of collection of the response; and
   a step for creating an image of the integrated circuit illustrating a value representing the propagation time for each point of application of the laser radiation.

2. A method according to claim 1, wherein it comprises:
   a step for exciting the circuit in the absence of laser radiation;
   a step for collecting the response of the circuit to the excitation;
   a step for calculating the propagation time in the absence of laser radiation separating the instant of excitation of the circuit from the instant of collection of the response; and the value representing the propagation time is equal to the variation in propagation time, this variation being defined by the difference between the propagation time in the presence of laser radiation at a determined point and the propagation time in the absence of laser radiation.

3. A method according to claim 1, wherein the laser radiation has a wavelength of between 800 nm and 1400 nm.

4. A method according to claim 3, wherein the laser radiation wavelength is chosen to be in the group including 1064 nm and 1340 nm.

5. A method according to claim 1, wherein the laser radiation is applied at each point in a manner that is synchronous with the step for exciting the circuit.

6. A method according to claim 1, wherein the laser radiation is applied at each point in a manner that is asynchronous with the step for exciting the circuit.

7. A method according to claim 1, wherein the laser radiation is pulsed with at least one pulse at each point of the circuit.

8. A method according to claim 1, wherein the laser radiation is modulated with at least one pulse at each point of the circuit.

9. A method according to claim 1, wherein the laser radiation is continuous.

10. An installation for analyzing an integrated circuit, wherein it comprises:
    means for applying laser radiation successively at a plurality of points on the surface of the integrated circuit;
    means for exciting the circuit for each application of the laser radiation at a point;
    means for collecting the response of the circuit to the excitation;
    means for calculating, for each point, the propagation time separating the instant of excitation of the circuit from the instant of collection of the response; and
    means for creating an image of the integrated circuit illustrating a value representing the propagation time for each point of application of the laser radiation.

* * * * *